(12) United States Patent
Khenkin et al.

(10) Patent No.: US 10,696,545 B2
(45) Date of Patent: Jun. 30, 2020

(54) TRANSDUCER PACKAGING

(71) Applicant: Cirrus Logic International Semiconductor Ltd., Edinburgh (GB)

(72) Inventors: Aleksey Sergeyevich Khenkin, Nashua, NH (US); David Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/007,799

(22) Filed: Jun. 13, 2018

(65) Prior Publication Data

US 2018/0362332 A1    Dec. 20, 2018

Related U.S. Application Data

(60) Provisional application No. 62/520,702, filed on Jun. 16, 2017.

(30) Foreign Application Priority Data

Jul. 31, 2017    (GB) .................................. 1712277.1

(51) Int. Cl.
 *B81B 7/00*    (2006.01)
 *H04R 19/04*   (2006.01)

(52) U.S. Cl.
 CPC .......... *B81B 7/0058* (2013.01); *B81B 7/0061* (2013.01); *H04R 19/04* (2013.01);
 (Continued)

(58) Field of Classification Search
 CPC ................ B81B 7/0058; B81B 7/0061; B81B 2201/0257; B81B 2207/096; H04R 19/04; H04R 2499/11; H04R 2201/003
 See application file for complete search history.

(56) References Cited

U.S. PATENT DOCUMENTS

| | | | |
|---|---|---|---|
| 9,769,554 B2 * | 9/2017 | Brioschi | H04R 19/005 |
| 10,278,281 B1 * | 4/2019 | Shcheglov | H05K 1/0271 |

(Continued)

FOREIGN PATENT DOCUMENTS

| | | |
|---|---|---|
| EP | 3065416 A1 | 9/2016 |
| WO | 2015164192 A1 | 10/2015 |
| WO | 2015189598 A1 | 12/2015 |

OTHER PUBLICATIONS

Combined Search and Examination Report, UKIPO, Application No. GB1712277.1, dated Jan. 23, 2018.

(Continued)

*Primary Examiner* — Oyesola C Ojo

(74) *Attorney, Agent, or Firm* — Jackson Walker L.L.P.

(57) ABSTRACT

The application describes a package for a MEMS transducer. The package has a package substrate having an acoustic port formed in the package substrate. The acoustic port comprises a first acoustic port volume portion and a second acoustic port volume portion, the first acoustic port volume portion being separated from the second acoustic port volume potion by a discontinuity in a sidewall of the substrate. The cross sectional area of the first acoustic port volume portion is greater than the cross sectional area of the second acoustic port volume portion. A barrier may be attached to the upper surface of the package substrate so as to seal or cover the acoustic port.

19 Claims, 10 Drawing Sheets

(52) U.S. Cl.
 CPC . *B81B 2201/0257* (2013.01); *B81B 2207/096* (2013.01); *H04R 2201/003* (2013.01); *H04R 2499/11* (2013.01)

(56) References Cited

U.S. PATENT DOCUMENTS

| | | | | |
|---|---|---|---|---|
| 2009/0175477 | A1* | 7/2009 | Suzuki | H04R 19/04 381/355 |
| 2012/0237073 | A1* | 9/2012 | Goida | H04R 1/02 381/361 |
| 2013/0129119 | A1* | 5/2013 | Miyatake | H04R 9/08 381/176 |
| 2014/0037120 | A1* | 2/2014 | Lim | H04R 1/04 381/355 |
| 2014/0044297 | A1* | 2/2014 | Loeppert | H04R 1/08 381/355 |
| 2014/0061892 | A1* | 3/2014 | Ziglioli | B81B 7/0058 257/704 |
| 2014/0064542 | A1* | 3/2014 | Bright | H04R 1/086 381/359 |
| 2014/0072164 | A1* | 3/2014 | Cohen | H04R 1/086 381/359 |
| 2014/0307909 | A1* | 10/2014 | Yang | H04R 19/005 381/369 |
| 2015/0041930 | A1* | 2/2015 | Kim | H04R 31/00 257/416 |
| 2015/0041931 | A1 | 2/2015 | Szczech et al. | |
| 2015/0217997 | A1 | 8/2015 | Grille et al. | |
| 2015/0230010 | A1* | 8/2015 | Suvanto | B06B 1/0292 381/150 |
| 2015/0264463 | A1* | 9/2015 | Kuzuyama | H04R 19/005 381/174 |
| 2016/0014530 | A1* | 1/2016 | Gao | H04R 19/04 257/416 |
| 2016/0037243 | A1* | 2/2016 | Lippert | H04R 1/023 381/166 |
| 2016/0261941 | A1* | 9/2016 | Brioschi | B81B 7/0058 |
| 2017/0006368 | A1* | 1/2017 | Brioschi | H04R 1/04 |
| 2018/0091881 | A1* | 3/2018 | Evans | H04R 1/08 |
| 2018/0317021 | A1* | 11/2018 | Dehe | B81B 7/0061 |

OTHER PUBLICATIONS

Search and Examination Report, UKIPO, Application No. GB1712277.1, dated May 9, 2018.

\* cited by examiner

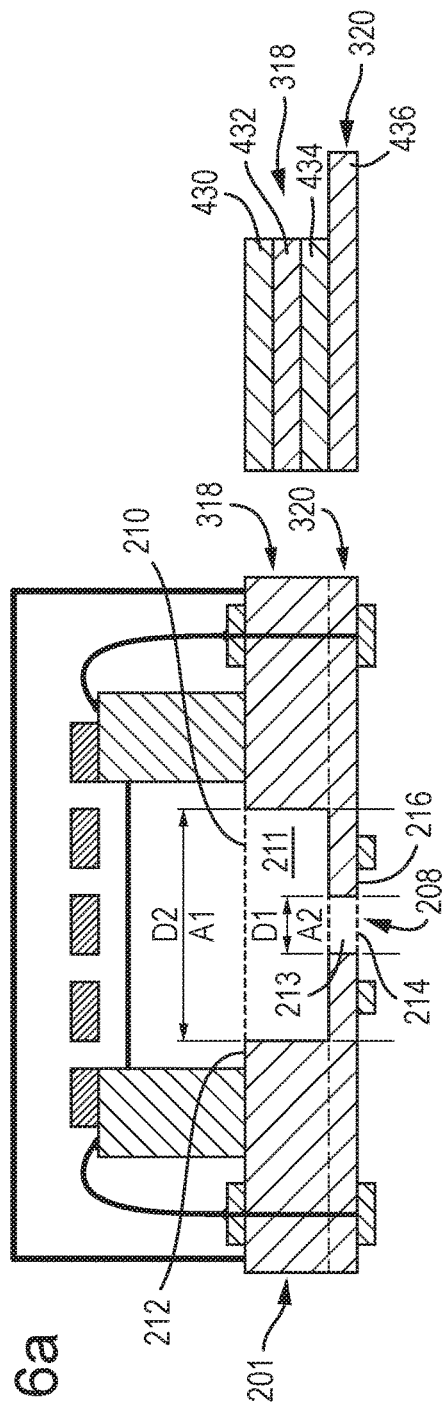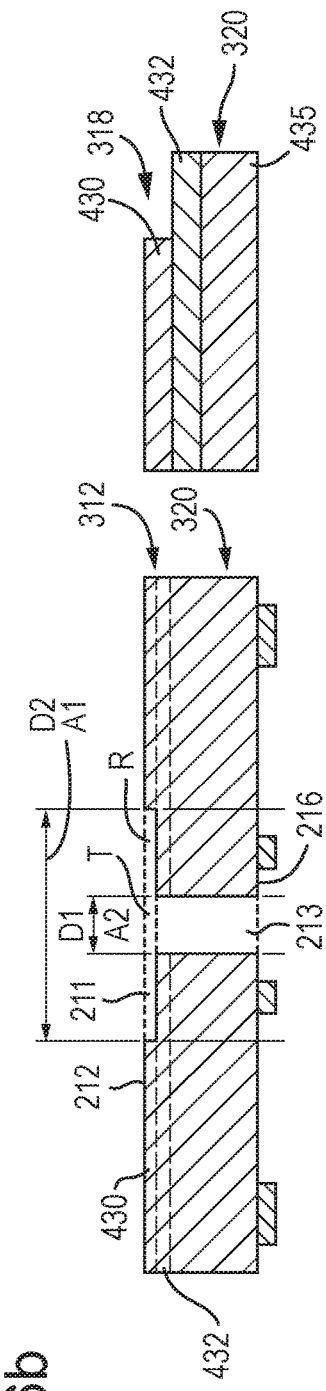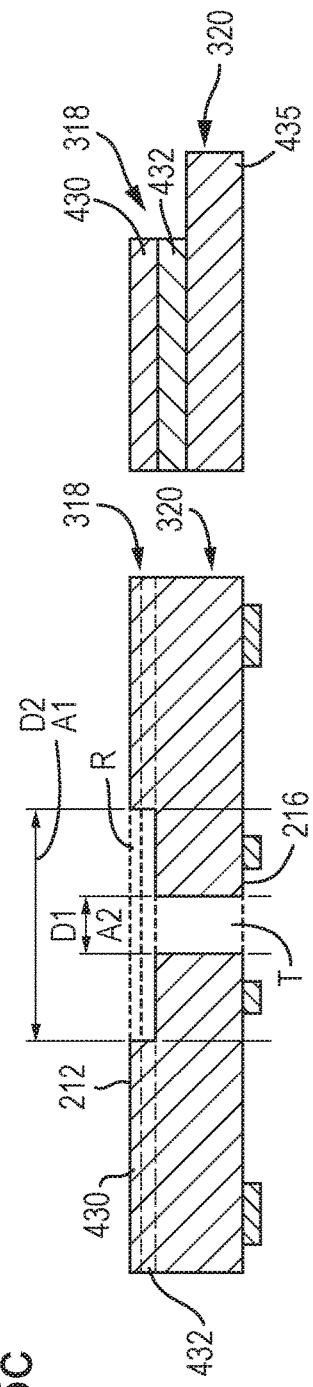
Fig. 6a
Fig. 6b
Fig. 6c

TRANSDUCER PACKAGING

TECHNICAL FIELD

This application relates to methods and apparatus for packaging of a MEMS transducer and to packages for or comprising a MEMS transducer, and, in particular, for providing a package for a MEMS transducer, such as a MEMS microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1a and 1b provide a schematic diagram and a perspective view, respectively, of a known capacitive MEMS microphone device 10. The capacitive microphone device 10 comprises a membrane layer 11 which forms a flexible membrane which is free to move in response to pressure differences generated by sound waves. A first electrode 3 is mechanically coupled to the flexible membrane, and together they form a first capacitive plate of the capacitive microphone device. A second electrode 2 is mechanically coupled to a generally rigid structural layer or backplate 4, which together form a second capacitive plate of the capacitive microphone device. In the example shown in FIG. 1a the second electrode 2 is embedded within the backplate structure 4.

The capacitive microphone is formed on a substrate 101, for example a silicon wafer, which may have upper and lower oxide layers 105, 103 formed thereon. A cavity or through-hole 8 in the substrate and in any overlying layers (hereinafter also referred to as a substrate cavity) is provided below the membrane, and may be formed for example using a "back-etch" through the substrate 101. The substrate cavity 8 connects to a first cavity 9 located directly below the membrane. These cavities 8 and 9 may collectively provide an acoustic volume thus allowing movement of the membrane in response to an acoustic stimulus. Interposed between the first and second electrodes 2 and 3 is a second cavity 10. A plurality of bleed holes 11 connect the first cavity 9 and the second cavity 10.

A plurality of acoustic holes 12 are arranged in the back-plate 4 so as to allow free movement of air molecules through the back plate, such that the second cavity 10 forms part of an acoustic volume with a space on the other side of the back-plate. The membrane 11 is thus supported between two volumes, one volume comprising cavities 9 and substrate cavity 8 and another volume comprising cavity 11 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 12 in the backplate 4. In such a case the substrate cavity 8 may be sized to provide at least a significant part of a suitable back-volume. In other applications, the microphone may be arranged so that sound may be received via the substrate cavity 8 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1a and 1b show the backplate 4 being supported on the opposite side of the membrane to the substrate 101, arrangements are known where the backplate is formed closest to the substrate with the membrane layer 11 supported above it.

In use, in response to a sound wave corresponding to a pressure wave incident on a MEMS microphone transducer, the membrane is deformed slightly from its equilibrium position. The distance between the lower electrode 3 and the upper electrode 2 is correspondingly altered, giving rise to a change in capacitance between the two electrodes that is subsequently detected by electronic circuitry (not shown).

To provide protection the MEMS transducer will typically be contained within a package. The package effectively encloses the MEMS transducer and can provide environmental protection and may also provide shielding for electromagnetic interference (EMI) or the like. The package also provides at least one external connection for outputting the electrical signal to downstream circuitry. For microphones and the like the package will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one of more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

Various package designs are known. For example, FIGS. 2a and 2b illustrate "lid-type" packages. A MEMS transducer 200 is mounted to an upper surface of a package substrate 201. The package substrate 201 may be PCB (printed circuit board), i.e. FR4, or any other suitable material. A cover or "lid" 209 is typically located over the transducer 200 and is attached to the upper surface of the package substrate 201. The cover 209 may, for example, be a metallic lid. An aperture 208 in the substrate 201 provides a sound port and the flexible membrane of the transducer extends over the sound port.

The package will typically also contain electrical circuitry 250, customised for a particular application, which may be integrated with the MEMS die as shown in FIG. 2b or provided separately as shown in FIG. 2a. The integrated circuit may provide bias to the transducer and may buffer or amplify a signal from the transducer. According to convention, the configuration shown in FIGS. 2a and 2b—in which the sound port 208 is provided on same side of the package to the external electrical connection—is known as a "bottom port" configuration. It will be appreciated that the term "bottom port" does not imply any particular orientation of the package device either during manufacture, processing or any subsequent application.

As a consequence of the need for a port hole, i.e. an acoustic port, within the package, environmental contamination in the form of, for example, solid particles, within the package will still arise. It will be appreciated that the presence of solid particles within any of the holes/cavities etc. of a MEMS transducer, in particular in the air gap between the two electrodes, i.e. between the backplate and the membrane, may have a detrimental effect on the performance and/or functionality of the device. For example, in the case of a MEMS microphone transducer, solid particles may enter the transducer package through the acoustic port, i.e. port hole, and may ultimately contaminate the transducer device via the substrate cavity. The occurrence of debris, i.e. particulate matter, within a MEMS transducer, and particularly within the acoustic apertures/cavities of a microphone transducer, may result in a number of problems including the occurrence of electrical shorts, mechanical blockage, i.e. occlusion, and corrosion. Thus, the performance of the MEMS may degrade over time as a result of particle contaminants and critical failure of the device is also possible if the movement of the membrane is inhibited by contaminant particles.

It will also be appreciated that water may enter the transducer package through the port hole. The presence of water within the MEMS cavities may also potentially affect transducer performance and/or functionality, e.g. by shorting out the electrodes and thus rendering the microphone inoperable.

It is known to provide a MEMS transducer with an environmental or ingress barrier, e.g. a particle filter for preventing, or at least inhibiting, particles from reaching the transducer. The environmental barrier, i.e. ingress barrier, may also prevent liquids, e.g. water, from reaching the transducer. However, such a filter or barrier also affects the functioning of the MEMS transducer as these barriers may interrupt or interfere with the transmission of pressure differentials incident on the transducer, as well as affect the transducer performance by, e.g., adding noise.

Examples described herein are concerned with MEMS transducers which incorporate an environmental filter in order to alleviate the problems associated with solid particle contamination and/or the ingress of liquids into the orifices/cavities of the transducer. Examples described herein are particularly, but not exclusively applicable to MEMS microphone transducers.

SUMMARY OF EMBODIMENTS

According to an example embodiment of a first aspect there is provided a package for a MEMS transducer comprising:

a package substrate having an acoustic port formed in the package substrate, wherein the acoustic port comprises a first acoustic port volume portion and a second acoustic port volume portion, the first acoustic port volume portion being separated from the second acoustic port volume portion by a discontinuity in a sidewall of the substrate.

The discontinuity may comprise a step. The discontinuity may be substantially a right angle. The discontinuity may be a slope.

The first acoustic port volume portion may have a greater diameter or diametric distance (e.g. diameter) than the second acoustic port volume portion. The term "diametric distance" may be understood in the context of examples in which the shape of the port is non-circular to be the distance between two opposing edges of the acoustic port. The first acoustic port volume portion may have a greater cross-sectional area than the second acoustic port volume portion.

The acoustic port may extend from a first opening in a first surface of the package substrate to a second opening in a second surface of the package substrate.

The discontinuity may comprise a change in the cross-sectional area of the acoustic port in a plane of package substrate.

The first acoustic port portion and the second acoustic port portion may meet in a plane parallel to the first surface of the package substrate.

According to an example of a second aspect there is provided a package for a MEMS transducer comprising:

a package substrate having an acoustic port formed in the substrate, wherein the acoustic port extends from a first opening in a first (upper) surface of the package substrate to a second opening in a second (lower) surface of the package substrate, and wherein the cross-sectional area of the opening in the first (upper) surface of the package substrate is greater than the cross sectional area of the opening in the second (lower) surface of the package substrate.

The package may further comprise a barrier, wherein the barrier may be provided at the first surface of the package substrate so as to overlie the acoustic port.

According to an example of a third aspect there is provided a package for a MEMS transducer having a package substrate, wherein;

an acoustic port extends from a first opening in a first (upper) surface of the package substrate to a second opening in a second (lower) surface of the package substrate; and a barrier is provided on or at the first surface of the package substrate.

The barrier may be supported in relation to the first surface of the package substrate so as to form a seal or cover over the acoustic port.

The first opening may be defined by a recess formed in the first surface of the package, the recess forming a first acoustic volume portion.

The cross-sectional area of the opening in the first surface of the package substrate may be greater than the cross sectional area of the opening in the second surface of the package substrate.

The shape of one or both of the first and second opening may be one or more of circular, square and rectangular.

The substrate may comprise a printed circuit board. The printed circuit board may comprise a multi-layer structure and the first opening in the first surface of the package substrate may be formed by a region of one or more upper layers of the printed circuit board where the material has been removed.

The package may comprise a MEMS transducer, wherein the MEMS transducer may comprise a flexible membrane.

The MEMS transducer may be provided within, or attached to, the package substrate such that the flexible membrane overlies the acoustic port.

The barrier may be provided between the flexible membrane of the MEMS transducer and the acoustic port. The barrier may be provided between the flexible membrane and the first surface of the package substrate. The barrier may be formed from a substantially non-porous material. The barrier may comprise one or more of silicone or rubber.

The barrier may be supported relative to the upper surface of the package substrate such that the barrier is able to flex in response to pressure variations. The barrier may be adhered to the first surface of the package substrate.

The barrier may comprise at least one bleed hole for pressure equalisation.

The barrier may move in response to a pressure differential across the barrier, and the movement of the barrier may cause a (corresponding) movement of the flexible membrane.

The barrier may substantially inhibit the flow, or block the ingress, of particles through the barrier. The barrier may be hydrophobic.

The barrier may substantially close the first opening.

The package may further comprise a lid.

According to an example of a fourth aspect there is provided a method of forming a package substrate comprising:
    forming an acoustic port in the package substrate between
        a first opening in a first (upper) surface of the package substrate and a second opening in a second (lower) surface of the package substrate; wherein
        the cross sectional area of the first opening is greater than the cross sectional area of the second opening.

The package substrate may comprise a multi-layer structure.

The method may comprise removing material from a region of one or more upper layers of the multi-layer structure to form a first acoustic port volume of the acoustic port, wherein the first acoustic port volume may defines the first opening in the first surface of the package substrate.

The multilayer structure may comprise first and second package substrate layers. The method may further comprise;
    forming a first hole through the first package substrate layer which defines the first opening in the first surface of the package substrate;
    forming a second hole through the second package substrate layer which defines the second opening in the second surface of the package substrate; and
    arranging the first package substrate layer on top of the second package layer.

The second (smaller) opening may at least partially underlie the first opening. The centre of the openings may coincide.

The second opening may be formed within an area defined by the first opening when projected onto the plane of the second package substrate layer.

A barrier may be formed so as to extend across, or so as to overlie, the first opening.

The MEMS transducer may comprise a capacitive sensor.

The MEMS transducer may comprise a microphone.

The package may comprise readout circuitry. The readout circuitry may comprise analogue and/or digital circuitry.

An electronic device may comprise the package. The electronic device may be at least one of: a portable device; a battery powered device; an audio device; a computing device; a communications device; a personal media player; a mobile telephone; a games device; and a voice controlled device.

To avoid unnecessary duplication of effort and repetition of text in the specification, certain features are described in relation to only one or several aspects or embodiments of the invention. However, it is to be understood that, where it is technically possible, features described in relation to any aspect or embodiment of the invention may also be used with any other aspect or embodiment of the invention.

BRIEF DESCRIPTION OF THE FIGURES

For a better understanding of the present invention and to show how the same may be carried into effect, reference will now be made by way of example to the accompanying drawings in which:

FIG. 1b is a perspective view of the MEMS microphone shown in FIG. 1a;

FIGS. 6a-6e illustrate a MEMS transducer package according to a further example embodiment;

The drawings may not be to scale and are for the purpose of illustration only.

Figure 1A:
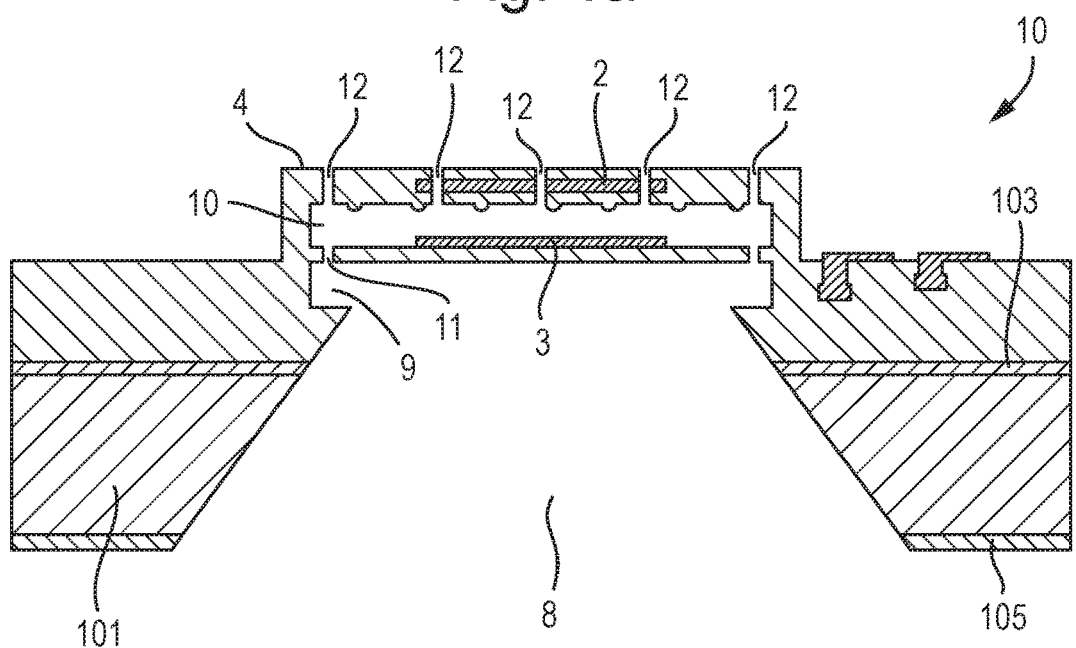
FIG. 1a is a schematic cross-sectional view of a MEMS microphone.
Figure 1B:
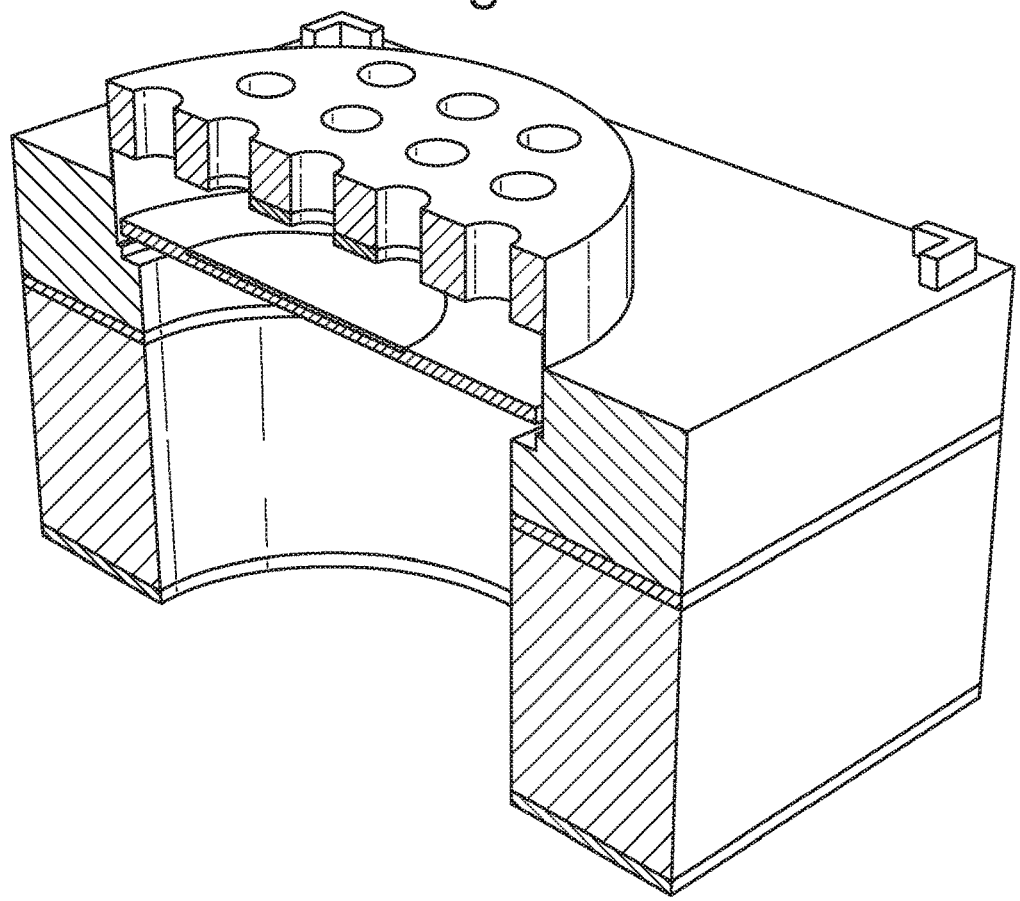
Figure 2A:
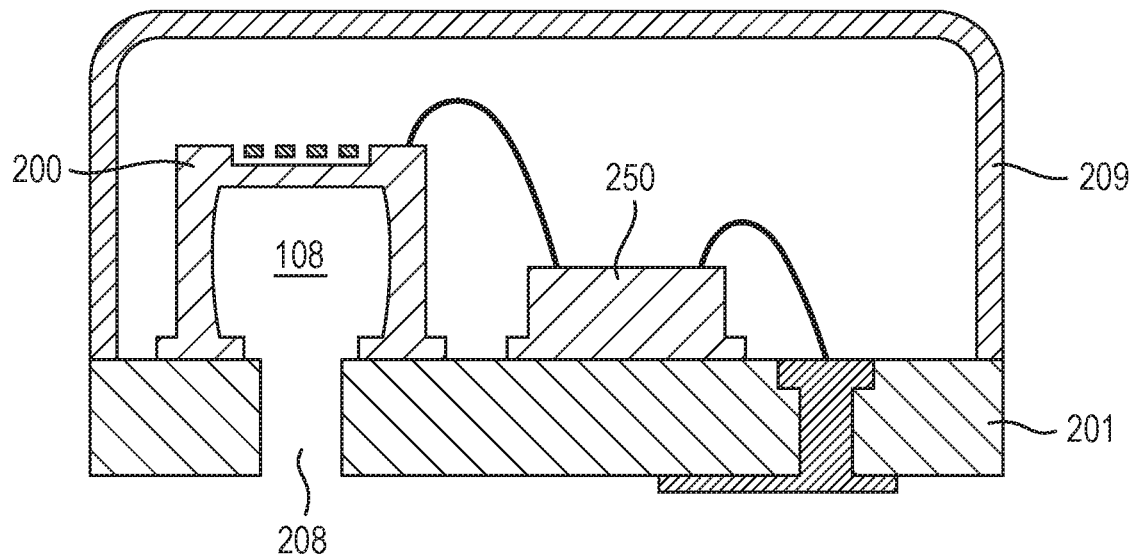
FIGS. 2a and 2b illustrate MEMS transducer packages.
Figure 2B:
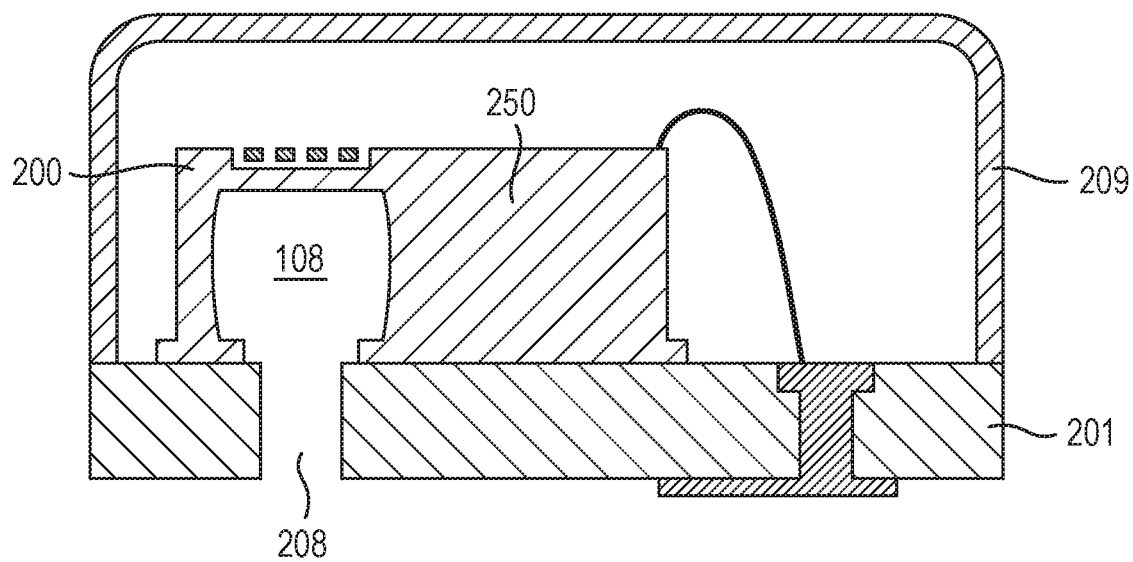
Figure 3:
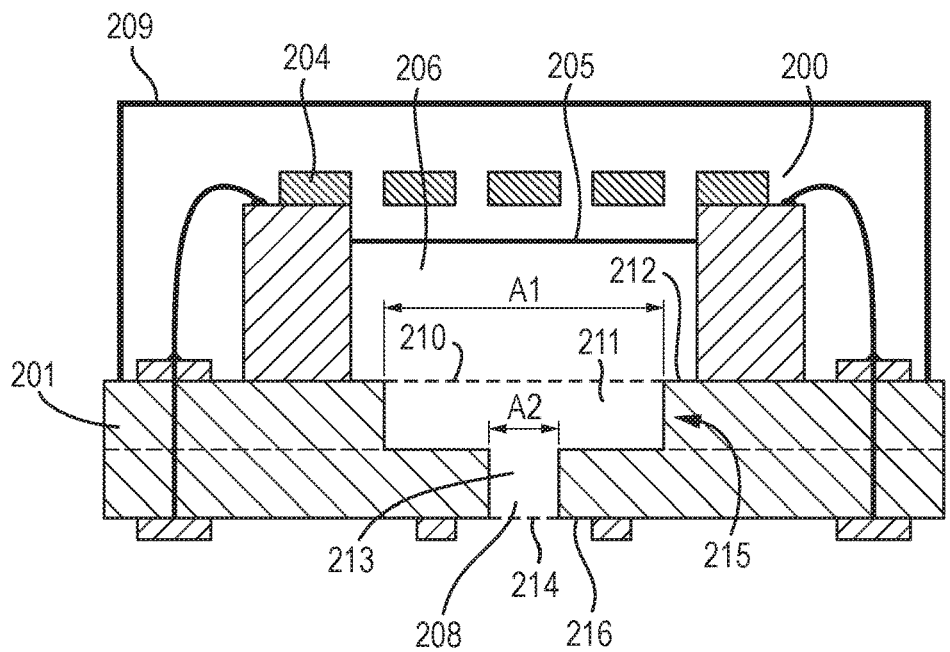
FIG. 3 illustrates a MEMS transducer package according to a first example embodiment.

FIG. 3 illustrates a cross-sectional view of a MEMS transducer package according to a first example embodiment. The package comprises a package substrate 201 and a package cover or lid 209. A MEMS transducer 200 is provided within the package. The MEMS transducer 200 is a capacitive MEMS microphone device 200 similar to the transducer shown in FIG. 1. The device 200 comprises a flexible membrane layer 205 supported relative to a substrate 201 of the transducer to define a front volume 206 of the transducer. A cavity defining an acoustic port 208 is provided in a package substrate 201, wherein the MEMS transducer is mounted to the package substrate 201 such that the front volume 206 of the transducer is situated between the flexible membrane layer 205 and the acoustic port 208. A first electrode (not illustrated) is mechanically coupled to the flexible membrane 205, and together they form a first capacitive plate of the capacitive microphone device. A second electrode (not shown) is mechanically coupled to a generally rigid structural layer or back-plate 204, which together form a second capacitive plate of the capacitive microphone device.

Thus, the acoustic port 208 comprises a hole, or cavity, which extends between (at least) two surfaces of the package substrate 201. The hole, or cavity, may be considered to define an acoustic path from a first opening in one side of the substrate 201 to a second opening in the opposing side of the substrate 201. The first opening 210 of the package substrate 201 is located at a first (top, or upper) surface 212 of the package substrate 201 whilst the second opening 214 of the package substrate is located at the second (bottom, lower) surface 216 of the package substrate. The hole or cavity which forms the acoustic port 208 therefore extends from the first opening 210 in the upper surface 212 of the package substrate to the second opening 214 in the lower surface 216 of the package substrate. The membrane 205 of the MEMS transducer is provided in a plane overlying the first surface 212 of the package substrate 201, and is positioned within the package so as to overlie, i.e. cover, the acoustic port 208.

The acoustic port 208 of the package substrate 201 is defined by a first acoustic port volume portion 211 and a second acoustic port volume portion 213. The first and second acoustic port volume portions together form the hole or cavity which extend between the first opening 210 in the upper surface 212 of the package substrate to the second opening 214 in the lower surface 216 of the package substrate. The first and second acoustic port volume portions 211, 213 meet in a plane parallel to the upper surface 212 of the substrate.

In the example shown in FIG. 3, the first acoustic port volume portion 211 is separated from the second acoustic port volume portion 213 by a discontinuity in a sidewall 215 of the acoustic port, or substrate 201. The sidewall of the acoustic port 208 is formed through the package substrate 201, between the upper surface 212 of the package substrate 201, and the lower surface 216 of the package substrate 201. Thus, the sidewall 215 can be considered to extend between the periphery of the first opening 210 and the periphery of the second opening 214. In this example embodiment, the discontinuity comprises a change in the cross sectional area of the acoustic port 208 in a plane of the package substrate, parallel to the upper surface 212 of the substrate. In this example embodiment, the change in the sidewall of the acoustic port is a step formed at a right angle relative to the sidewall. However, it will be appreciated that various other ways of forming a discontinuity in the sidewall may be envisaged. For example, the discontinuity may be formed by a sloped section of the sidewall.

The cross sectional area A1 of the first opening 210 in the upper surface 212 of the package substrate 201 is greater than the cross sectional area A2 of the second opening 214 in the lower surface 216 of the package substrate 201. Furthermore, the diametric distance (e.g. diameter) between opposing portions of the first acoustic port volume is greater than the diametric distance between opposing portions of the second port volume. It will be appreciated that the first and/or second port volume may exhibit any outline shape (which will be defined by considering a horizontal cross section through the port volume), including circular, square or rectangular. Thus, the term "diametric distance" is intended to encompass the distance between opposing portions of the first/second port volume regardless of the outline shape of the port volume.

The first acoustic port volume 211 may be considered to be a recess formed in the upper surface of the package substrate 201, wherein the recess extends only partially through the package substrate 201, whilst the acoustic port 208 may be considered to be a hole that extends all the way through the package substrate 201. The package substrate 201 may comprise a plurality of layers. Thus, the recess may be considered to comprise a region wherein one or more of the layers have been removed (e.g. by etching, milling and/or drilling).

Figure 4A:
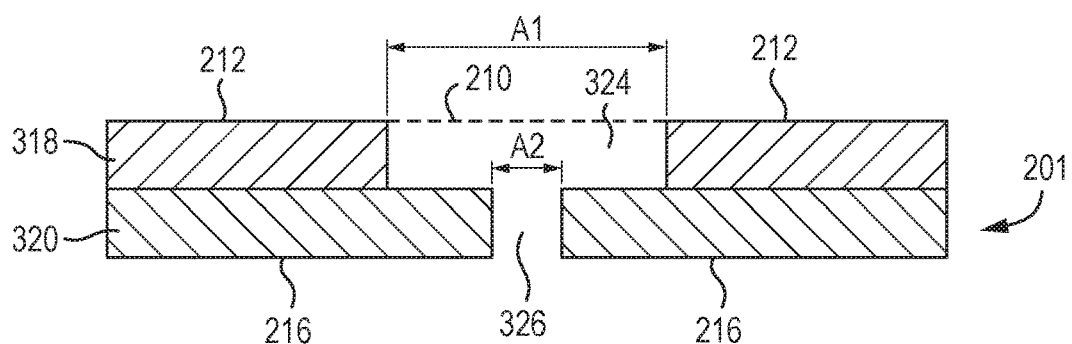
FIG. 4a illustrates a package substrate according to an example embodiment.

As shown in the embodiment of FIG. 4a, the package substrate 201 may be formed from multiple layers, where the layers may be fixed or joined together. In this example, the package substrate comprises two layers (or laminates) that are laminated or bonded together. A first substrate layer 318 is provided in a plane overlying a second substrate layer 320. The first substrate layer 318 forms an upper surface 212 of the package substrate 201, and the second substrate layer 320 forms a lower surface 216 of the package substrate 201. Each substrate layer 318, 320 is provided with a cavity which extends from a first (upper) surface of the respective layer to the opposite surface of the respective layer. Thus, when the two layers 318, 320 are bonded together, a first cavity 324 in the first substrate layer 318 extends through the first substrate layer from the first opening 210 in the upper surface 212 of the package substrate 201 in a direction perpendicular to the plane of the first opening 210 and meets a second cavity 326 formed in the second substrate layer 320 in a plane substantially parallel to the upper surface 212 of the package substrate 201. The second cavity 326 extends through the second substrate layer 320 from the second opening 214 in the lower surface 216 of the package substrate 201 in a direction perpendicular to the plane of the second opening 214.

The first cavity 324 of the first substrate layer 318 has a cross sectional area A1 which is larger than the cross sectional area A2 of the second cavity 326 formed in the second substrate layer 320. The cavities 324, 326 are aligned so that at least part of the respective cross sectional areas A1, A2 of the cavities overlap. In this example, the first and second substrate layers 318, 320 are positioned relative to each other such that the centre of the cavities of each substrate layer substantially coincide.

Figure 4B:
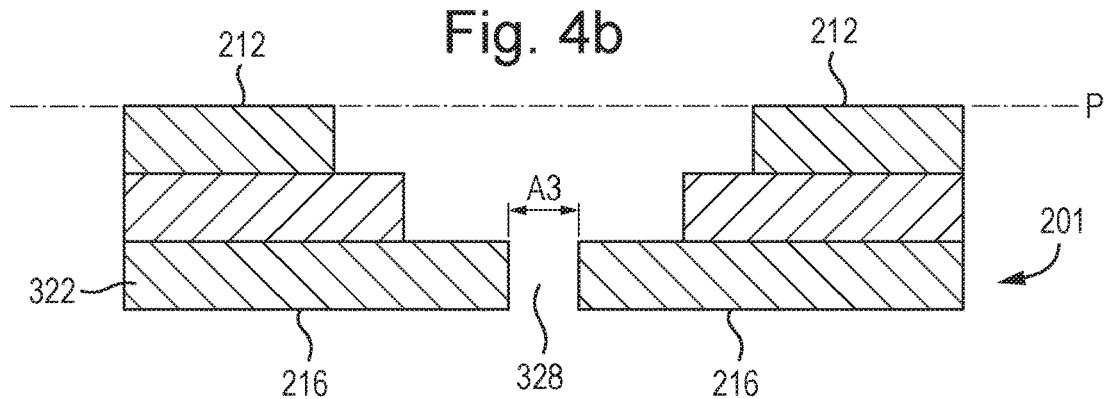
FIG. 4b illustrates a package substrate according to an alternative example embodiment.

FIG. 4b illustrates a further example in which the package substrate 201 comprises three layers. Thus, in addition to the first and second layers 318, 320 illustrated in FIG. 4a a further, third, substrate layer 322 also forms part of the package substrate 201. In this example, the layers are arranged such that first substrate layer 318 is provided on top of the second substrate layer 320, and the second substrate layer 320 is provided on top of the third substrate layer 322. The second substrate layer 320 is therefore provided between the first and third substrate layers 318 and 322. Therefore, in this example, the upper surface of the first substrate layer 318 forms the upper surface 212 of the package substrate 201, and the lower surface of the third substrate layer 322 forms the lower surface 216 of the package substrate 201.

The third substrate layer 322 comprises a third cavity 328. The cavity provided in the third substrate layer 322 has a cross sectional area A3 which is smaller than the respective cross sectional areas A1 or A2 of either first or second cavity provided in the first or second layers. Thus, the largest cavity is provided at the top surface of the substrate 201, and the smallest cavity is provided at the bottom surface of the substrate 201. In this manner, any number of substrate layers, i.e. laminates, provided with cavities may form the package substrate 201.

The cavities in each layer of the package substrate 201 may be formed by removing a portion of material or materials from each layer. The package substrate 201 may be formed before or after the removal of material from each of the layers. For example, starting with a package substrate 201 comprising a plurality of layers, material may be removed, e.g. milled out, from each layer to form a cavity in each layer. Alternatively, the layers may be formed individually, where cavities may be formed within each layer, for example, by punching holes through each layer. The layers may then be attached in a fixed relation to one another. In this case, the layers are arranged relative to each other such that the respective cross sectional area of the each of the cavities at least partially overlaps with the respective cross sectional area of cavity in each adjacent layer.

It is useful to compare the relative size of the cross sectional areas of each of the cavities by considering the cross-sectional area of each cavity when projected onto a common plane. As illustrated in FIGS. 4a and 4b, the cross sectional area of the cavity having the smallest cross sectional area, when projected onto a common plane (e.g. the plane P of the upper surface of the package substrate) is contained within the cross sectional area of the cavity having the next largest cross sectional area, and so on.

Figure 5A:
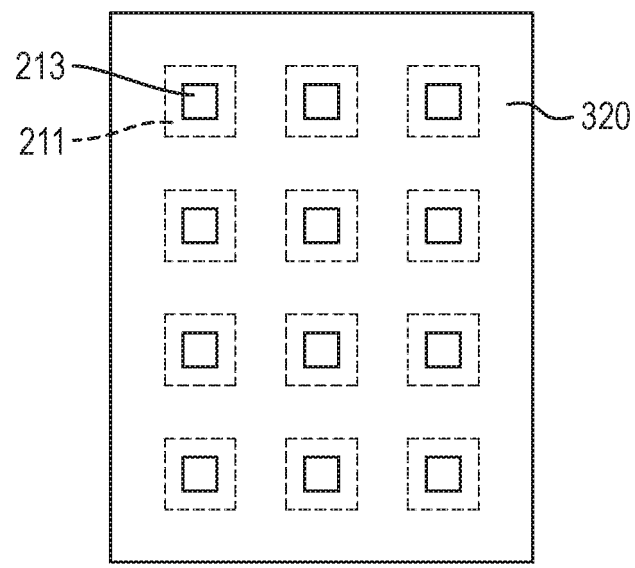
FIGS. 5a and 5b illustrate a top view of a package substrate according to an example embodiment.
Figure 5B:
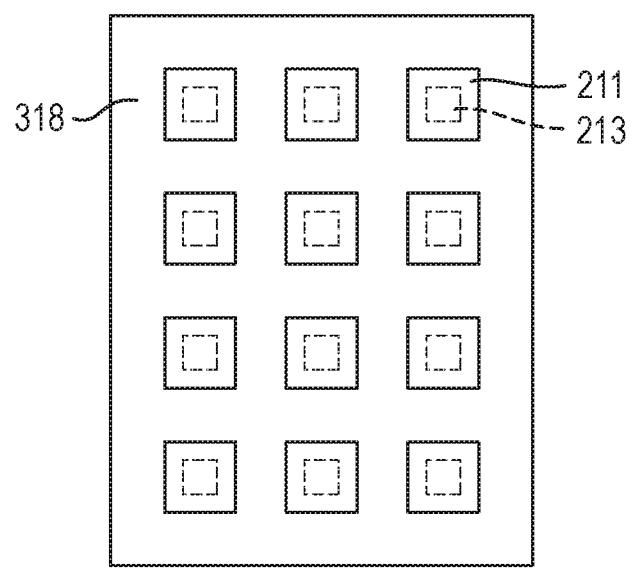

FIGS. 5a and 5b illustrate the relative arrangement of two panels from which the package substrate 201 according to the example embodiment illustrated in FIG. 4a may be fabricated. Specifically, FIG. 5a shows a plan view of a panel which forms the second substrate layer 320, i.e. laminate 2, of a transducer package, the panel having a plurality of square shaped apertures formed through the panel between an upper surface of the panel to a lower surface of the panel. Each square shaped aperture will form a second acoustic volume portion 213 of a package substrate 201. The dashed lines illustrate the outline of a plurality of square shaped apertures formed in another panel which underlies the panel and which forms the first substrate layer 318, i.e. laminate 1, of a transducer package, when projected onto the plane of the panel in a direction normal thereto. The dashed lines thus indicate the relative planar position of the first acoustic volume portion 211.

FIG. 5b shows a plan view of the panel which forms the first substrate layer 318 of a transducer package, the panel having a plurality of square shaped apertures formed through the panel between an upper surface of the panel to a lower surface of the panel. Each square shaped aperture will form a first acoustic volume portion 211 of a package substrate 201. The dashed lines illustrate the outline of a plurality of square shaped apertures formed in a another panel which underlies the panel and which forms second substrate layer 320 of a transducer package, when projected onto the plane of the panel in a direction normal thereto. The dashed lines thus indicate the relative planar position of the first acoustic volume portion.

FIGS. 5a and 5b thus illustrates the relative positioning of the cavities in the substrate layers of the package substrate 201. As is shown in FIG. 5a, the apertures (solid line) in the panel which will form the second layer 320 of the package substrate 201 have a smaller cross sectional area than the apertures (dashed line) formed in the first substrate layer 318. Furthermore, it can be appreciated that the centres of the cavities of the two panels 318, 320 substantially coincide or are mutually overlapping. In this example embodiment, the cavities are shown to be square in shape. However, the cavities could be any shape, including circular, rectangular or any other polygonal shape, regular or irregular.

FIGS. 6a-6e illustrate a further example of a package substrate 201 where the substrate comprises multiple substrate layers to form a multi-layer structure. In this example, the multi-layer substrate 201 comprises a printed circuit board (PCB), i.e. FR4. Generally, the layers of a PCB comprise a solder mask, or solder resist, a metal layer, for example copper, and at least one layer of a base material, formed from, for example, fibreglass, or any substantially non-conductive material. However, as would be understood by a skilled person, the types of material and number of layers comprising the PCB are not limited to those mentioned herein.

An acoustic port 208 is formed through the multi-layer package substrate 201 from a first opening 210 in the upper surface of the substrate to a second opening 214 in the lower surface 216 of the substrate 201. Thus, the port extends through a plurality of layers which form the PCB. The overall shape of the acoustic port 208—in particular the peripheral edge of the acoustic port—is defined by the shape of a hole formed through each of the overlapping layers of the PCB.

According to this example, the cross sectional area A1 of the first opening 210 in the upper surface 212 of the package substrate 201 is greater than the cross sectional area A2 of the second opening 214 in the lower surface 216 of the package substrate 201.

The acoustic port can be considered to comprise a recess volume R and a through-hole volume T. The recess volume can be considered to be defined as extending from the upper surface of the package substrate only part of the way through the package substrate. The recess may be formed, e.g. by removing a region of one or more upper layers of the package substrate. Thus, the recess formed in the upper surface comprises a region where one or more layers of the substrate has been removed. The depth of the recess may be conveniently determined by the depth or thickness of one or more layers of a multi-layer substrate structure which are removed. The through-hole region can be considered to be the portion of the acoustic port which extends all the way through the package substrate. Thus, in the examples illustrated in FIGS. 6b and 6c, the recess region can be considered to be the portion of the acoustic port that is laterally outside the through-hole region. The layer(s) of the substrate from which material is removed to form the recess may be considered to form the first substrate layer.

As illustrated in FIG. 6a, the package substrate 201 may comprise one or more layers of solder resist 430, metal 432 (provided underneath the solder resist 430) and insulating material 434, 436. The first substrate layer 318 of such a package substrate may be considered to be formed of the layers of solder resist 430, metal 432, and a first layer of laminate material 434. The second substrate layer 320 may, in this case, be considered to be formed of a second layer of laminate material 436. It will be appreciated that numerous other configurations are also possible. For example, FIG. 6b illustrates an example in which the first substrate layer may be formed from a layer of solder resist 430, and the second substrate layer from a metal layer 432 and a layer of laminate material 435. Alternatively, as illustrated in FIG. 6c, the solder resist 430 and metal 432 may be considered to form the first substrate layer, and a layer of laminate material 435 may be considered to form the second substrate layer.

Figure 6D:
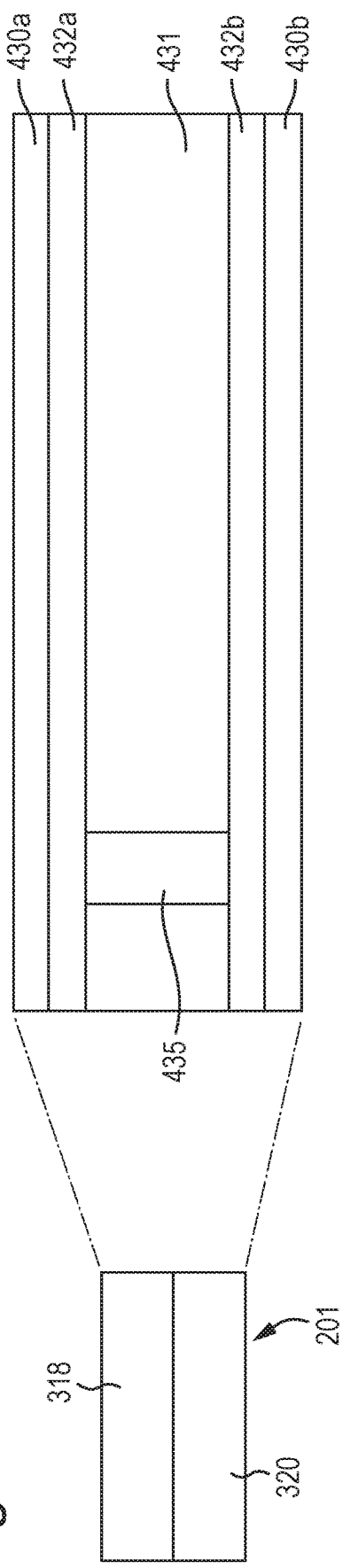
Figure 6E:
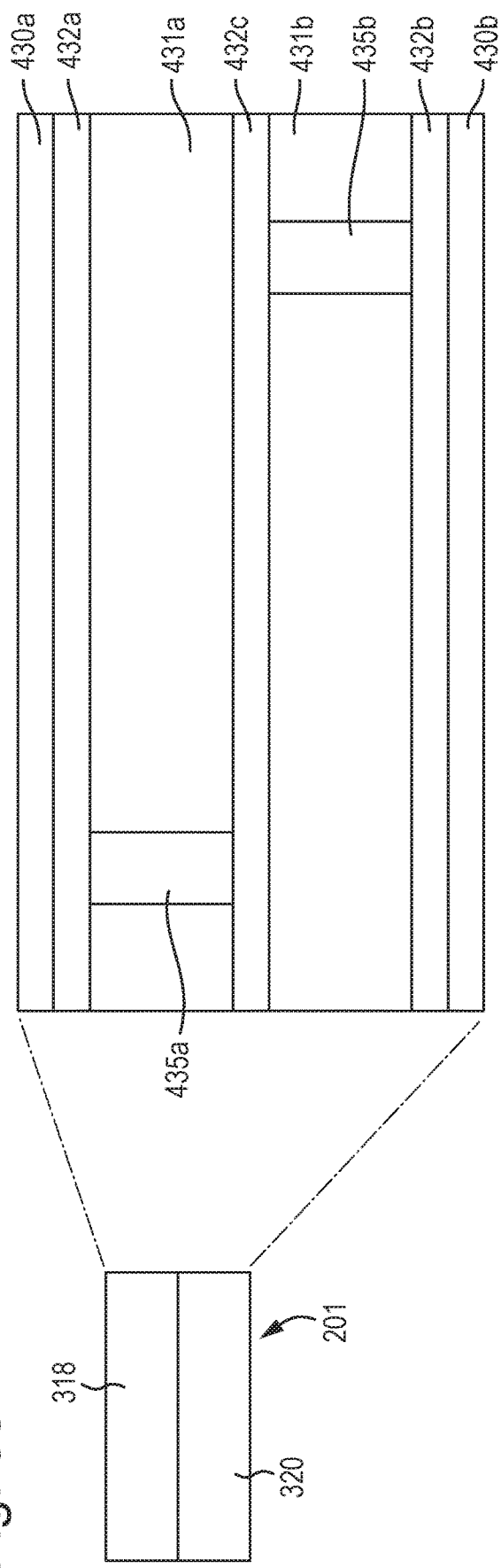

As is shown in the further example embodiments in FIG. 6d and FIG. 6e, the package substrate may be provided with more than one metal layer, where the metal layers are electrically connected by through vias.

FIG. 6d illustrates a configuration in which the package substrate 201 comprises a first and second metal layer 432a, 432b which are separated by a non-conductive material 431. The metal layers 432a, 432b are electrically connected by a via 435 which passes through the non-conductive material. The external faces of the metal layers each comprise a layer of solder resist 430a, 430b. The first 318 and second 320 substrate layers are formed from the layers of the multi-layer substrate.

FIG. 6e shows a similar configuration to that shown in FIG. 6e, wherein a third metal layer 432c is provided between the first and second metal layers 432a, 432b. The third metal layer 432c is separated from the first metal layer 432a by a first non-conductive material 431a, and the third and first metal layer are connected by a first via 435a. Similarly, the third metal layer 432c is separated from the second metal layer 432b by a second non-conductive material 431b. The third and second metal layers are connected by a second through via 435b.

In the same manner as the examples detailed above, the first substrate layer 318 as shown in FIGS. 6d and 6e may comprise any number of adjacent layers of material from the top of the package substrate 201 downwards, and the second substrate layer 320 may comprise the remaining adjacent layers of material. The first and second substrate layer 318, 320 may each comprise a part of the layer at which they meet.

It should be appreciated that any number of metal layers may be provided between the first 432a and second 432b metal layers. The further metal layers may be separated from one another by non-conductive layers, and electrically connected to one another by through vias which pass through the non-conductive layers.

It is envisaged that the acoustic port hole may optionally be formed in a fabrication step that is distinct from a prior, or subsequent, fabrication step to form the recess.

Figure 7A:
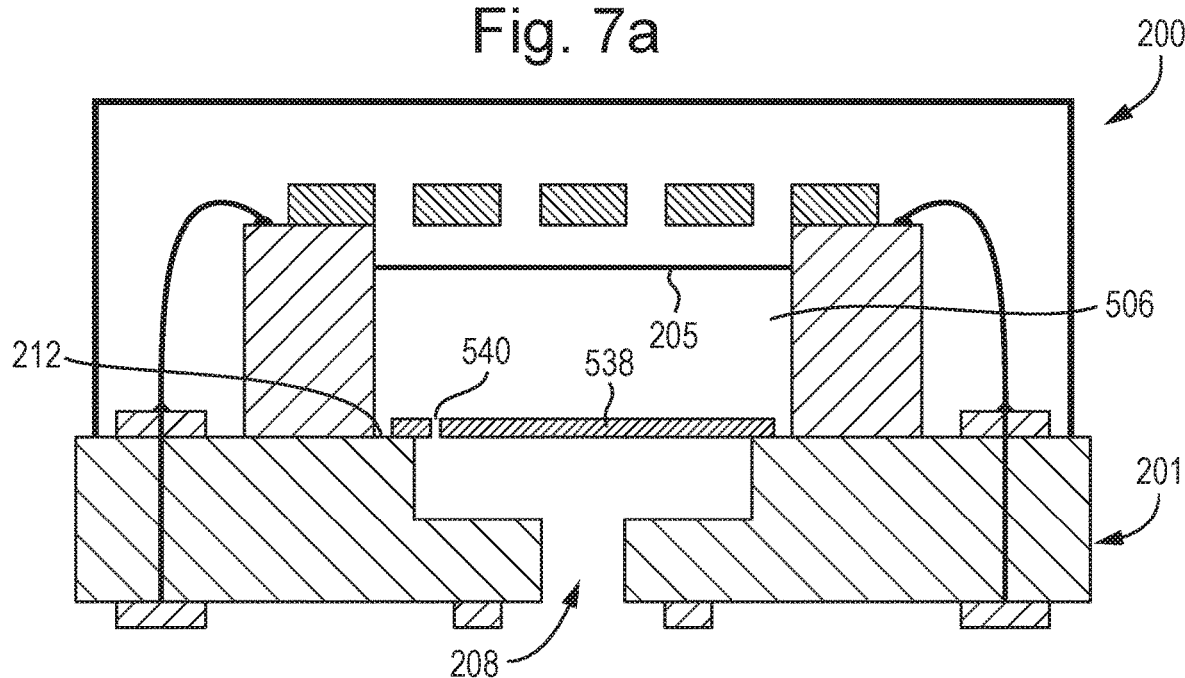
FIG. 7a illustrates a MEMS transducer package according to an example embodiment.

In the embodiment illustrated in FIG. 7a, the MEMS transducer package 200 is further provided with a barrier or soft seal 538. The barrier 538, which may be formed from a thin layer of rubber, silicone or similar compliant sealing material, serves to provide environmental protection to the region of the transducer between the barrier 538 and the flexible membrane 205. As shown in FIG. 7a the barrier 538 is provided at the upper surface 212 of the package substrate 201 so as to overlie the acoustic port 208. In this configuration, the barrier 538 is therefore positioned between the flexible membrane 205 and the upper surface 212 of the package substrate (or the acoustic port). A volume 506 is thus defined between the flexible membrane 205 and the barrier 538. Thus, in this example the barrier is provided in a plane directly above the package substrate 201 and extends in a region outside the periphery of the first opening 210 in the upper surface 212.

The barrier 538 may be adhered, or pinned, to the upper surface 212 of the package substrate so as to be able to deflect, or move, in response to an incident pressure wave. Thus, the barrier can be considered to be compliantly attached to the package substrate 201.

The barrier or seal 538 may beneficially serve to inhibit or prevent solid particle contaminants before they reach the membrane structure of the transducer. Thus, the barrier may serve to alleviate the risk of performance degradation, corrosion or other undesirable consequences of contamination within the MEMS transducer. In particular, by positioning the barrier 538 at or near or on the upper surface 212 of the package substrate 201, the risk that contaminants may build up within the cavity between the barrier and the flexible membrane is reduced.

Figure 7B:
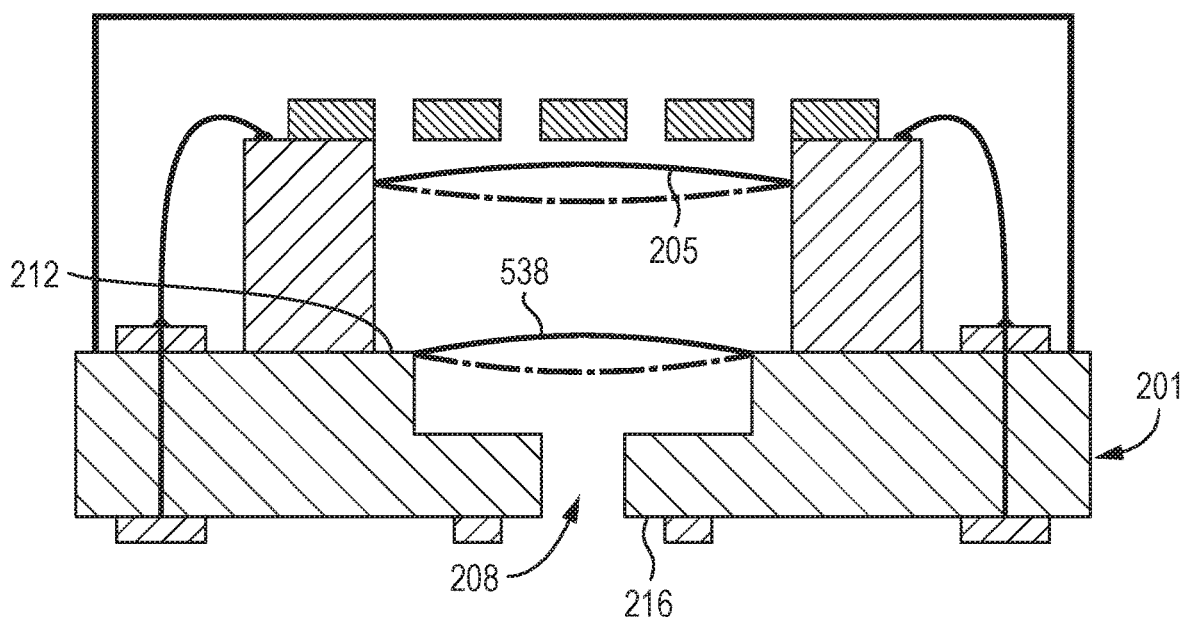
FIG. 7b illustrates the MEMS transducer package according to an example embodiment in use.

FIG. 7b illustrates the operation of the MEMS transducer in use. As illustrated in FIG. 7b, the barrier 538 is supported relative to the upper surface 212 of the package substrate such that the barrier is able to flex in response to pressure waves incident on the barrier 538 which enter the acoustic port 208. Thus, the barrier 538 moves in response to a pressure differential across the barrier, or pressure impinging on the barrier, and movement of the barrier causes a corresponding or reciprocal movement of the flexible membrane 205. The barrier may have an acoustical compliance that is preferably greater than that of the flexible membrane 205. This beneficially enables the barrier 538 to deflect with a greater amplitude than the flexible membrane 205, thereby minimising signal loss.

The barrier can be described as acting in a manner similar to a piston, where movement of the barrier in response to acoustic pressure waves incident on the barrier gives rise to a force acting on the air between the barrier and the flexible membrane. This force is transmitted by the air to the underside of the acoustic membrane, causing the barrier and the membrane to move together.

Furthermore, according to examples according to the present aspect, the barrier may serve to dampen pressure shock waves generated during a high pressure event such as if the device is dropped or at electrostatic discharge. Thus, examples described herein may benefit from improved robustness.

The barrier may be formed from any material with suitable properties. It is desirable for the barrier to be formed from a substantially non-porous material, e.g. silicone, and for the material to be able to flex in response to a pressure differential. It is also desirable for barrier to be thin, and have a low mass.

The barrier may be provided on one or both sides with a hydrophobic coating which will serve to resist the build-up of water molecules on the barrier. For example, one or more of the surfaces of the barrier may be coated on with a hydrophobic material such as polytetrafluoroethylene, PTFE ($C_2F_4$) commonly used and wall passivation in deep reactive ion etch (Bosch) process. Thus, the barrier may further serve as a hydrophobic barrier to inhibit water molecules from entering the volume between the barrier and the flexible membrane.

The barrier 538 may comprise at least one bleed hole 540, to allow static pressure equalisation between the volumes defined either side of the barrier. The barrier preferably deflects with a higher amplitude in response to a given pressure differential than the flexible membrane. In other words, the barrier is more flexible or compliant than the membrane. The provision of at least one bleed hole in the barrier may provide a reduction in the low-frequency response of the barrier.

It will be appreciated that the characteristics of the barrier, e.g. the frequency response of the barrier, will depend on one or more of the compliance of the barrier, the manner in which the barrier is supported with respect to the substrate and the mass of the barrier. This in turn affects the response of the flexible membrane and the performance of the transducer.

Furthermore, the shape and dimensions of the underlying acoustic port affects the movement of the barrier in response to pressure differentials. Specifically, the provision of a recess in the upper surface of the package substrate having a relatively large cross sectional area enables the barrier to flex more readily and thus enhances the compliance of the barrier. In other words, the provision of a first acoustic volume portion having a large (relative to the cross sectional area of a standard acoustic port or relative to the second acoustic port volume portion) cross-sectional area serves increase the mechanical compliance of the barrier creates an acoustic circuit having a relatively low acoustic impedance for pressure waves. It may be desirable for the opening in the lower side of the package substrate to have a smaller cross-sectional area than the opening in the upper surface, in order to control the transmission of sound or pressure waves into the acoustic port.

The design of the acoustic port corresponding to the examples given herein improves the response of the flexible membrane, even when a barrier is provided between the acoustic port and the flexible membrane.

The provision of a relatively large first opening in the substrate pack compared to the second opening which forms the lower portion of the acoustic port, in combination with the barrier, as described herein, may beneficially cause a relatively low impedance relative to the input impedance of the microphone, which minimises signal loss.

Figure 8A:
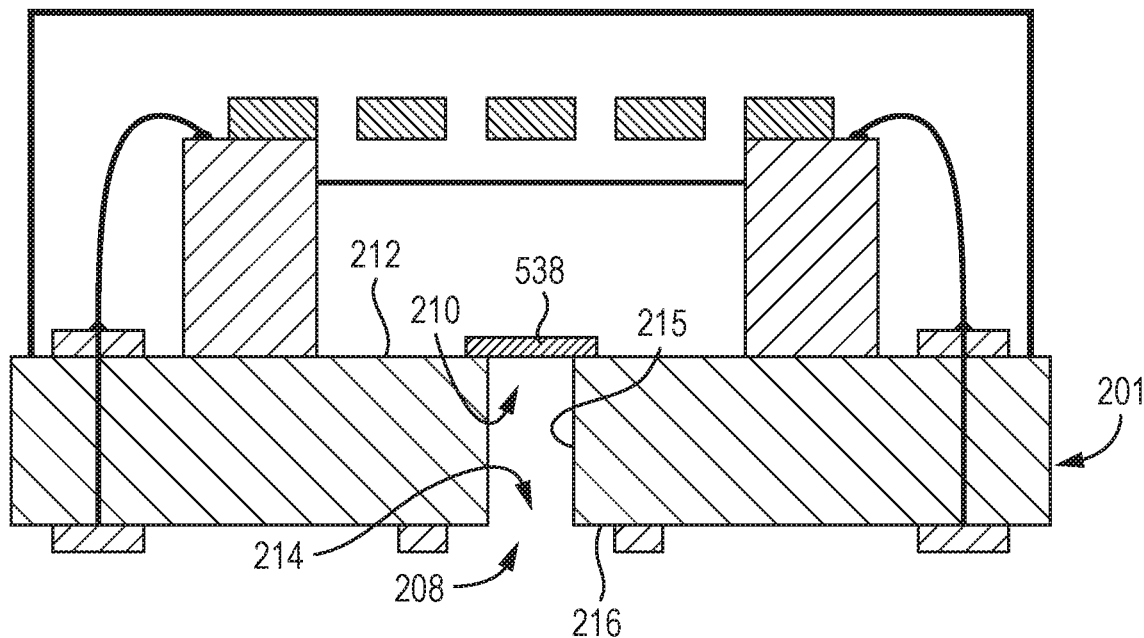
FIGS. 8a-8c illustrate MEMS transducer packages according to a further example embodiments.

FIG. 8a illustrates an alternative configuration in which the cross sectional area of the first opening 210 in the upper surface 212 of the package substrate 201 is the same as the cross sectional area of the second opening 214 in the lower surface 216 of the package substrate 201. A cavity which forms the acoustic port 208 is thus provided between the first and second openings such that an acoustic path is formed between said openings. The centres of the two openings are coincident on a line perpendicular to the upper surface of the package substrate. As illustrated in FIG. 8a the cross sectional area of the acoustic port is substantially uniform throughout. Thus, there is no discontinuity in the sidewall of acoustic port.

The acoustic port 208 of this example may be formed from a single substrate layer. Alternatively, the acoustic port 208 may be formed in the manner described in relation to any of the Figures above, in which cavities are formed in each of the layers of the package substrate. The cavities may be formed before the layers are joined together, or once the package substrate 201 is formed. In this embodiment, the planar shape and cross sectional area of each cavity in each layer would be substantially the same, and the centres of corresponding cavities in each layer would coincide on a line perpendicular to the first opening 210 in the upper surface 212 of the package substrate 201.

A barrier 538 similar to that described in relation to FIGS. 7a and 7b is provided, where the barrier is adhered, or pinned, at the first, upper, surface of the package substrate. The barrier is provided in a plane directly above the package substrate and extends a small distance into a region laterally outside the periphery of the first opening 210 in the upper surface 212. It will be appreciated that the lateral dimension or the diametric distance—of the opening may be selected such that the barrier exhibits a required degree of flexibility or compliance.

Figure 8B:
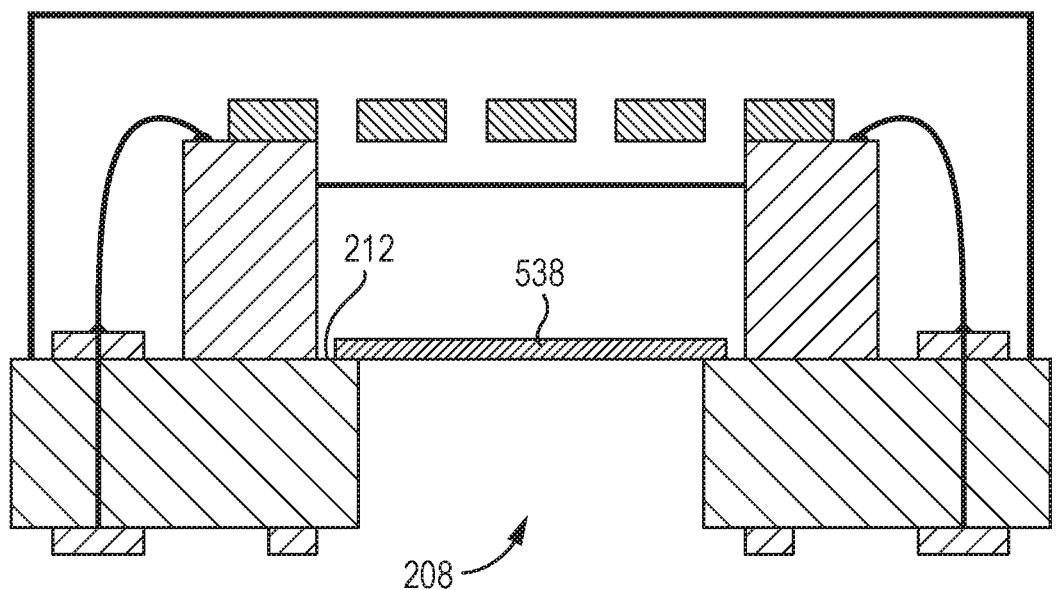

FIG. 8b shows a configuration similar to that shown in FIG. 8a, differing in that the acoustic port 208 has a greater cross sectional area than that shown in FIG. 8a. A barrier 538 is again provided at the first, upper, surface 212 of the package substrate.

Figure 8C:
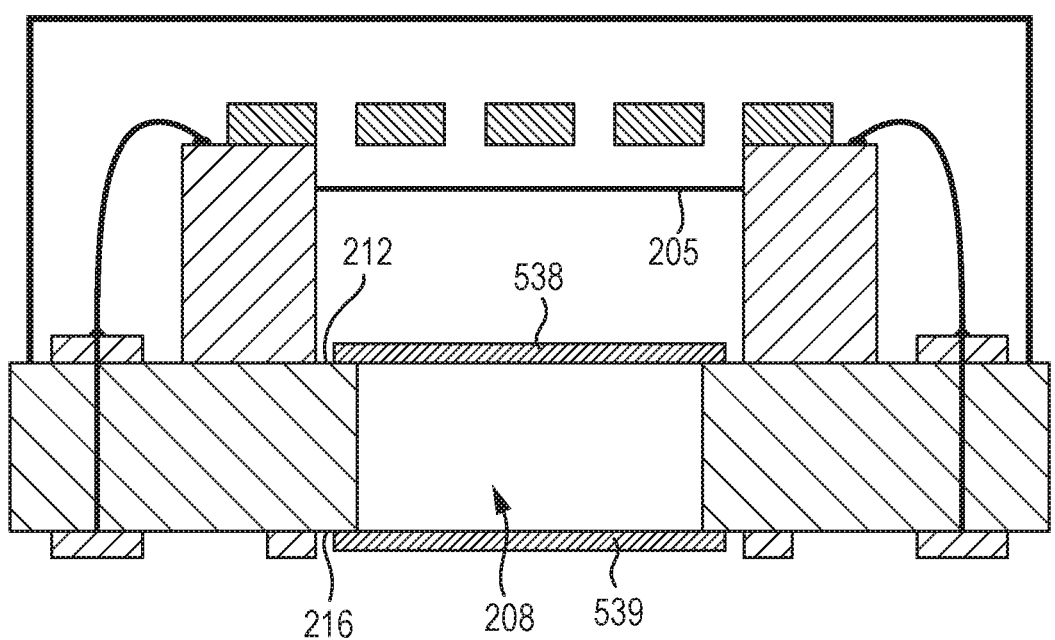

In a further example shown in FIG. 8c, a second barrier 539 is provided at the second, lower, surface 216 of the package substrate 201. Thus, a barrier is provided at both the upper and lower surface of the package substrate 201. The second barrier 239 may be provided on, or at, the lower surface of the package substrate 201, or within the acoustic port 208. Pressure impinging on the second barrier 539 will cause a reciprocal or corresponding movement of the first barrier 538, which in turn will cause a reciprocal or corresponding movement of the flexible membrane layer 205.

Figure 9:
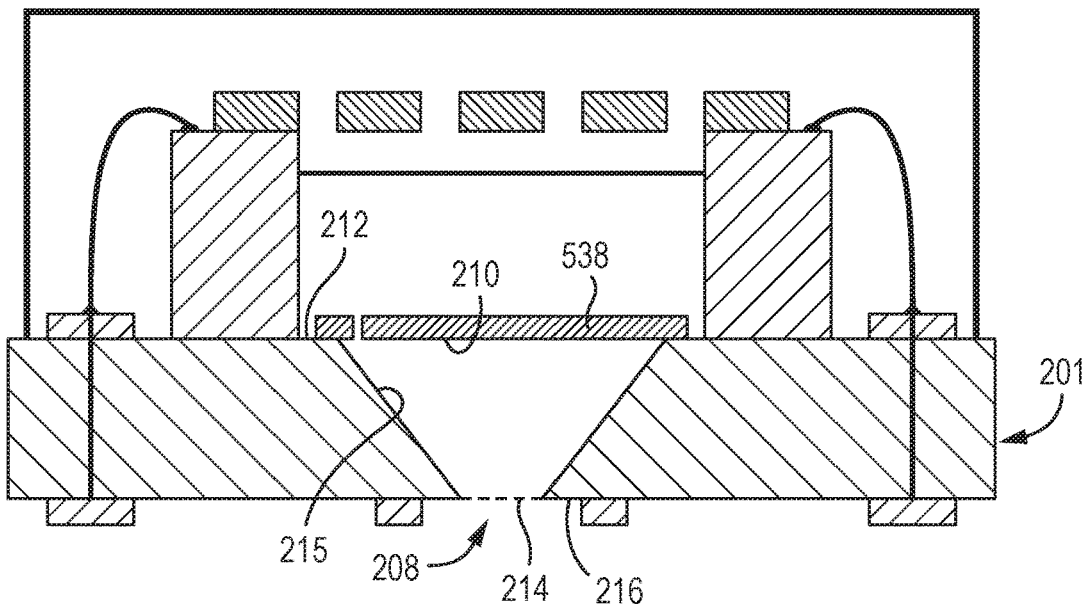
FIG. 9 illustrates a MEMS transducer package according to a further example embodiment.

FIG. 9 demonstrates another embodiment similar to that shown in FIG. 7a, in which the cross sectional area of the first opening 210 in the upper surface 212 of the package substrate 201 is the greater than the cross sectional area of the second opening 214 in the lower surface 216 of the package substrate. A cavity is formed between the two openings such that a hole, or acoustic port 208, is formed through the substrate, and a barrier 538 is provided over the acoustic port.

This embodiment differs from that described in relation to FIG. 7, as the cross sectional area of the cavity varies proportionately to the distance from the first or second opening. Specifically, the sidewalls 215 of the hole are sloped such that the distance between opposing portions of the sidewall(s) increases from the plane of the second opening in the lower surface of the packages substrate to the plane of the first opening in the upper surface of the package substrate. Thus, acoustic port may be conical in shape.

This cavity or acoustic port may, for example, be formed by drilling a hole in the package substrate between the upper and lower surfaces of the package substrate, preferably using a chamfered drill bit. Alternatively, the cavity may be formed by any of the methods described above.

Figure 10A:
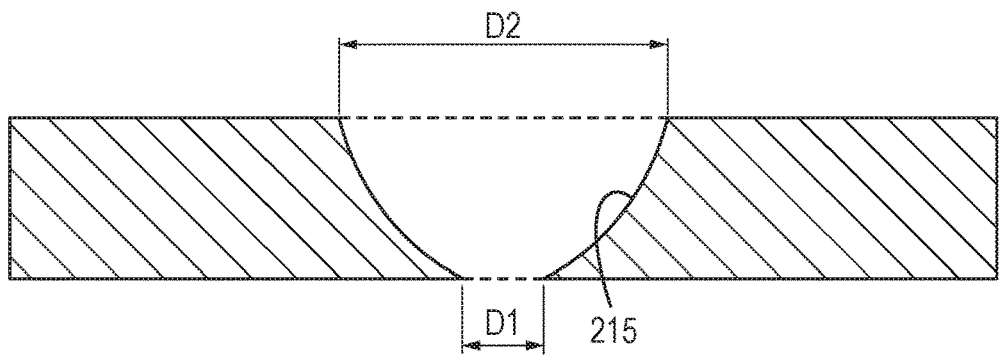
FIGS. 10a and 10b illustrate a package substrates according to further examples.
Figure 10B:
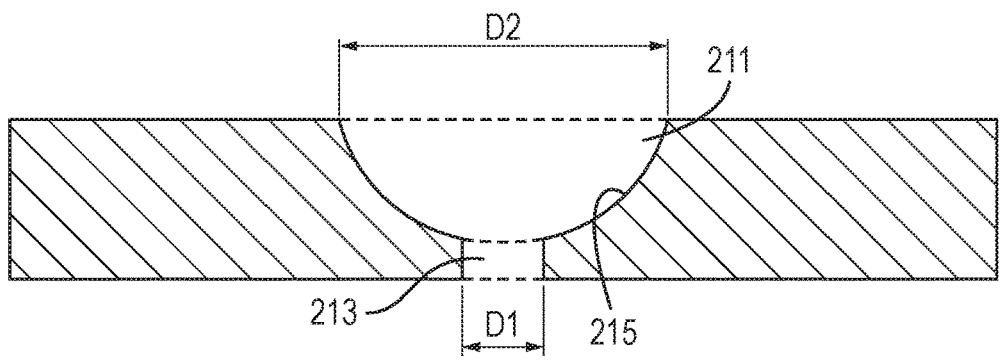

FIGS. 10a and 10b illustrate a number of variations to the example described in relation to FIG. 9, wherein the cross sectional area of the cavity varies proportionately to the distance from the first or second opening.

In the example shown in FIG. 10a, the hole which forms the acoustic port 208 can be considered to be substantially dome shaped. Thus, the sloped sidewall(s) 215 is curved.

Alternatively, as shown in FIG. 10b, the acoustic port 208 comprises two differently shaped acoustic port volume portions. In this example, the first acoustic port volume portion 211 is substantially dome shaped as in FIG. 10a, whilst the second acoustic port volume portion 213 exhibits a uniform cross section.

The flexible membrane layer 205 of a MEMS transducer generally comprises a thin layer of a dielectric material—such as a layer of crystalline or polycrystalline material. The membrane layer may, in practice, be formed by several layers of material which are deposited in successive steps. The flexible membrane may, for example, be formed from silicon nitride Si3N4 or polysilicon. Crystalline and polycrystalline materials have high strength and low plastic deformation, both of which are highly desirable in the construction of a membrane. The membrane electrode of a MEMS transducer is typically a thin layer of metal, e.g. aluminium, which is typically located in the centre of the membrane, i.e. that part of the membrane which displaces the most. It will be appreciated by those skilled in the art that the membrane electrode may be formed by an alloy such as aluminium-silicon for example. The membrane electrode may typically cover, for example, around 40% of area of the membrane, usually in the central region of the membrane. Thus, known transducer membrane structures are composed of two layers of different material—typically a dielectric layer (e.g. SiN) and a conductive layer (e.g. AlSi).

In some applications the backplate of a MEMS transducer may be arranged in the front volume, so that incident sound reaches the membrane via the acoustic holes in the backplate. In such a case the cavity of the transducer substrate may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst the illustrated examples show the backplate being supported on the opposite side of the membrane to the substrate, arrangements are known where the backplate is formed closest to the substrate with the membrane layer supported above it.

In order to process an electrical output signal from the microphone, the die/device may have circuit regions (not shown) that are integrally fabricated using standard CMOS processes on the substrate. The circuit regions may comprise conducting (for example aluminium or copper) circuit interconnects that are used to electrically connect to the microphone via interconnect points to the circuit region.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 10 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

The examples are applicable to any form of MEMS transducers including microphones, pressure sensors or ultrasonic transmitters/receivers.

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensor or ultrasonic transducers. The example embodiments may also be used in a number of applications, including, but not limited to consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer package having a package substrate, wherein:
   an acoustic port extends from a first opening in a first surface of the package substrate to a second opening in a second surface of the package substrate;
   a flexible membrane overlies the acoustic port; and a barrier is provided on or at the first surface at the first opening of the package substrate between the flexible membrane and the acoustic port; wherein the barrier moves in response to a pressure differential across the barrier, and the movement of the barrier causes a corresponding movement of the flexible membrane.

2. A package as claimed in claim 1, wherein the barrier is supported in relation to the first surface of the package substrate so as to form a seal or cover over the acoustic port.

3. A package as claimed in claim 1, wherein the first opening is defined by a recess formed in the first surface of the package, the recess forming a first acoustic volume portion.

4. A package as claimed in claim 1, wherein the cross-sectional area of the opening in the first surface of the package substrate is greater than the cross sectional area of the opening in the second surface of the package substrate.

5. A package for a MEMS transducer as claimed in claim 1, wherein the shape of one or both of the first and second opening may be one or more of circular, square and rectangular.

6. A package as claimed in claim 1, wherein the substrate comprises a printed circuit board.

7. A package as claimed in claim 6, wherein the printed circuit board comprises a multi-layer structure and wherein the first opening in the first surface of the package substrate is formed by a region of one or more upper layers of the printed circuit board where material has been removed.

8. A package as claimed in claim 1, further comprising a MEMS transducer, wherein the MEMS transducer comprises a flexible membrane.

9. A package as claimed in claim 8, wherein the MEMS transducer is provided within the package such that the flexible membrane overlies the acoustic port.

10. A package as claimed in claim 1, wherein the barrier is provided between the flexible membrane and the first surface of the package substrate.

11. A package as claimed in claim 1, wherein the barrier is formed from a substantially non-porous material.

12. A package as claimed in claim 1, wherein the barrier comprises one or more of silicone or rubber.

13. A package as claimed in claim 1, wherein the barrier is supported relative to the upper surface of the package substrate such that the barrier is able to flex in response to pressure variations.

14. A package as claimed in claim 1, wherein the barrier is adhered to the first surface of the package substrate.

15. A package as claimed in claim 1, wherein the barrier comprises at least one bleed hole for pressure equalisation.

16. A package as claimed in claim 1, wherein the barrier substantially inhibits the flow of particles through the barrier.

17. A package as claimed in claim 1, wherein the barrier is hydrophobic.

18. A package as claimed in claim 1, wherein the barrier substantially closes the first opening.

19. A package as claimed in claim 1, wherein the package further comprises a lid.

* * * * *